United States Patent [19]

Bottari et al.

[11] Patent Number: 5,151,386
[45] Date of Patent: Sep. 29, 1992

[54] METHOD OF APPLYING METALLIZED CONTACTS TO A SOLAR CELL

[75] Inventors: Frank J. Bottari, Acton; Jack Hanoka, Brookline; Frank W. Sylva, North Billerica, all of Mass.

[73] Assignee: Mobil Solar Energy Corporation, Billerica, Mass.

[21] Appl. No.: 561,101

[22] Filed: Aug. 1, 1990

[51] Int. Cl.[5] .................... H01L 21/44; H01L 21/48
[52] U.S. Cl. ........................... 437/187; 437/2; 437/8; 437/180; 437/245; 101/150; 101/163; 101/170; 136/256
[58] Field of Search .............. 437/2, 8, 187, 180, 437/245; 101/150, 170, 163; 136/256

[56] References Cited

U.S. PATENT DOCUMENTS

| | | | |
|---|---|---|---|
| 3,701,317 | 10/1972 | Miyamoto et al. | 101/170 |
| 4,019,436 | 4/1977 | Handweiler et al. | 101/170 |
| 4,066,585 | 1/1978 | Schepp et al. | 101/170 |
| 4,235,644 | 11/1980 | Needes | 136/256 |
| 4,402,262 | 9/1983 | Handforth | 101/170 |
| 4,737,197 | 4/1988 | Nagahara et al. | 136/256 |
| 4,865,999 | 9/1989 | Xi et al. | 437/2 |

OTHER PUBLICATIONS

Imtran Industries Inc. Brochure entitled "Imtran 150 Series Pad Transfer Printing Machine".
Imtran Industries Inc. publication entitled "History of Pad Printing".
Tampoprint America Inc. brochure entitled "Pad Printing".
Ghandhi, *VLSI Fabrication Principles*, Wiley-Interscience Publication, New York, 1983, p. 2.
Heinz Groh, "Pad Printing Impresses the Plastics Industry", Plastics Engineering, Jun. 1987, pp. 39–41.
G. W. Scott, Jr., "A Look at the Changes in Semiconductor Device Printing/Marketing", Microelectronic Manufacturing and Testing, Aug. 1988.
S. Duccilli, "Pad Printing", Screen Printing, Apr. 1989, pp. 62–70 and 152.

*Primary Examiner*—Brian E. Hearn
*Assistant Examiner*—Kevin M. Picardat
*Attorney, Agent, or Firm*—Pandiscio & Pandiscio

[57] ABSTRACT

A method of applying metallized contacts to the surfaces of semiconductor substrates using a conventional pad printing device. Standard screen printing inks diluted 2-30 weight percent with an appropriate solvent have been satisfactorily used to accomplish the method. For certain contact configurations, portions of the surface of the substrate are covered with a Mylar mask during the pad printing process. The method makes it possible to form a metallized contact having a uniform thickness on an uneven substrate surface, e.g., the surface of a silicon substrate produced by the EFG method.

20 Claims, 6 Drawing Sheets

METHOD OF APPLYING METALLIZED CONTACTS TO A SOLAR CELL

FIELD OF THE INVENTION

The present invention relates to methods of fabricating solar cells, and more particularly to methods of applying metallized conductors to the front and back surfaces of a solar cell substrate.

BACKGROUND OF THE INVENTION

A number of techniques exist for applying metallized contacts or conductors to the front and back surfaces of a solar cell substrate. Unfortunately, these known techniques typically suffer from one or more drawbacks which limit their utility. Such drawbacks include excessive material costs, unreasonably long application times, lack of uniformity of thickness of the metallized contact, and excessive breakage rates of the solar cell substrates as a consequence of application of the metallization.

One such known technique, commonly identified as screen printing, involves applying a screen having a metallization pattern formed therein to one side of a substrate. A metal screen printing ink is then spread over the metallization pattern in the screen and onto the surface of the underlying substrate using a narrow elongate blade which is moved across the screen in direct contact therewith. After removing the screen the metallized ink is fired to drive off the binder in the ink and cause the metal in the ink to adhere to the substrate. Such screen printing methods are described in U.S. Pat. Nos 4,293,451 and 4,388,346.

Screen printing is an effective technique for applying metallized contacts to certain types of solar cell substrates. Unfortunately, screen printing suffers from several drawbacks when used to apply metallized contacts to solar cell substrates which are relatively brittle and have irregular, uneven surfaces. First, application of metallized inks by screen printing to EFG-grown solar cell substrates often results in significant variation in the thickness of contacts formed from the metallized inks. This variation in thickness is caused by the surface configuration of EFG substrates. Typically the surfaces of EFG-grown substrates have undulations or random peaks and depressions with a flatness deviation in the range of 4 to 10 mils. Because the printing screen rests on the high points of an uneven or irregular substrate surface, the thickness of the metallized contacts formed by the screen printing process may vary significantly over the width and length of the metallized contact. Such variation in thickness can result in the excessive use of metal printing ink, thereby adding to the overall cost of the solar cell. Additionally, if the metal ink is applied in a thickness greater than that required for satisfactory electrical current flow, as occurs with those portions of the screen printed contacts overlying the low spots of the substrate, the substrate may tend to bow as a result of stresses caused by the firing process which bonds the metal ink to the substrate Such bowing is disadvantageous because it can lead to cell breakage and can make the attachment of discrete solar cells to a large solar cell array problematic.

A second problem with applying metallized contacts to a brittle solar cell substrate having uneven surfaces by screen printing is that an unacceptably large number of substrates typically break as a consequence of the process. Such breakage is believed to occur due to the relatively large forces applied, as measured on a per unit of surface area basis, to the substrate by the narrow blade used to spread the metal ink across the screen.

Techniques such as spraying or evaporative deposition may be used to apply metallized layers having a uniform thickness to a solar substrate. Unfortunately, such techniques involve masking and other limitations. Photolithography may also be used to apply metallized layers in the form of a pattern, such as that of a front surface grid electrode for a solar cell. However, photolithography adds to the time and cost of producing a solar cell substrate.

In fields of technology unrelated to the production of solar cells, it is known to apply patterns to objects having an irregular surface by a technique commonly identified as pad printing. For instance, pad printing is used to apply decorative patterns to golf balls, watch faces, china, glassware and toys. Conventional pad printing devices typically include a gravure plate having an etched-out portion corresponding in configuration to the pattern to be printed etched therein, a workpiece support, an ink applying pad, and a blade support having a flood blade and doctor blade attached thereto. The pad and blade assembly are attached, in mutually-spaced relation, to a movable carriage. After attaching a workpiece to the workpiece support, printing ink is poured onto the surface of the gravure plate. Then, the flood blade is drawn across the gravure plate so as to spread printing ink into the etched portion of the plate. The doctor blade is then used to remove ink from all but the etched portion of the gravure plate. The pad is then (1) lowered into contact with the gravure plate to pick up the ink on the etched portion of the gravure plate, (2) raised and moved over the workpiece, (3) lowered into contact with the workpiece, and (4) raised up away from the workpiece, leaving an ink pattern printed on the workpiece.

Conventional pad printing processes (i.e., pad printing applied to commercial articles such as china, glassware, golf balls, watch faces, toys, etc.) have certain characteristics which render the processes unsuitable as a method of applying metallized conductors to a solar cell substrate. The thickness of a pattern applied by conventional pad printing processes typically is about 0.25 to about 1.0 mils thick when the ink is still wet, and ranges from about 1.0 to about 2.0 microns after the ink has been fired. Solar cells, on the other hand, require metallized conductors having a thickness of at least about 4-10 microns after firing. Also, known pad printing techniques are not believed to involve the use of conductive metal inks to form electrical conductors. Further with regard to prior known pad printing techniques, with time the surface of the gravure plate and the working edge of the doctor blade often become nicked or scored, with the result that stray ink deposits are picked up by the pad and deposited so as to extend away from the printed pattern. With solar cells, such stray ink patterns could be problematic, depending upon their placement, since they may electrically couple the front and back sides of the solar cell, thereby destroying isolation of the p/n junction.

OBJECTS AND SUMMARY OF THE INVENTION

One object of the present invention is to provide a method of applying metallized contacts to a solar cell substrate so as to reduce significantly the incidence of substrate breakage as a consequence of the process.

Another object of the present invention is to provide a method of applying metallized contacts to solar cell substrates having uneven surfaces so that the contacts conform to the irregularities of the surfaces to which they are applied, thereby ensuring that the thickness of the contacts is substantially uniform across their width and length.

A further object is a new and improved method of applying front and rear contacts to a solar cell.

These and other objects are achieved by a method of applying metallized contacts to a solar cell substrate using a conventional pad printing device and specialized metal printing inks. The metallized contacts are applied to the substrates using a process similar to conventional pad printing techniques, except for the following modifications. First, a mask is positioned on the back side of the substrate, prior to printing the back side contact, to ensure that stray ink deposits are not applied to the peripheral edge of the back side. Second, the invention uses metal printing inks that are formulated to ensure that (1) the fired metallized contacts have the desired conductivity and (2) the ink can be applied easily and surely in a thickness that will permit the fired contacts to have a thickness ranging from 4 to 10 microns. The thickness of the contacts is further controlled by controlling the depth of the depressions or wells in the gravure plate. As a further optional feature, the construction and configuration of the pad used to apply the metallized contacts may be modified according to the size and shape of the contact to be applied.

After the contacts are applied by the pad printing process, the substrates are fired to drive off the solvent and binder in the printing ink and to securely bond the contacts to the substrate.

The pad printing process may be used to apply a rear ohmic contact and/or a grid-like front ohmic contact to solar cells.

BRIEF DESCRIPTION OF THE DRAWINGS

For a fuller understanding of the nature and objects of the present invention, reference should be made to the following detailed description taken in connection with the accompanying drawings wherein.

DETAILED DESCRIPTION OF THE INVENTION

Figure 1:
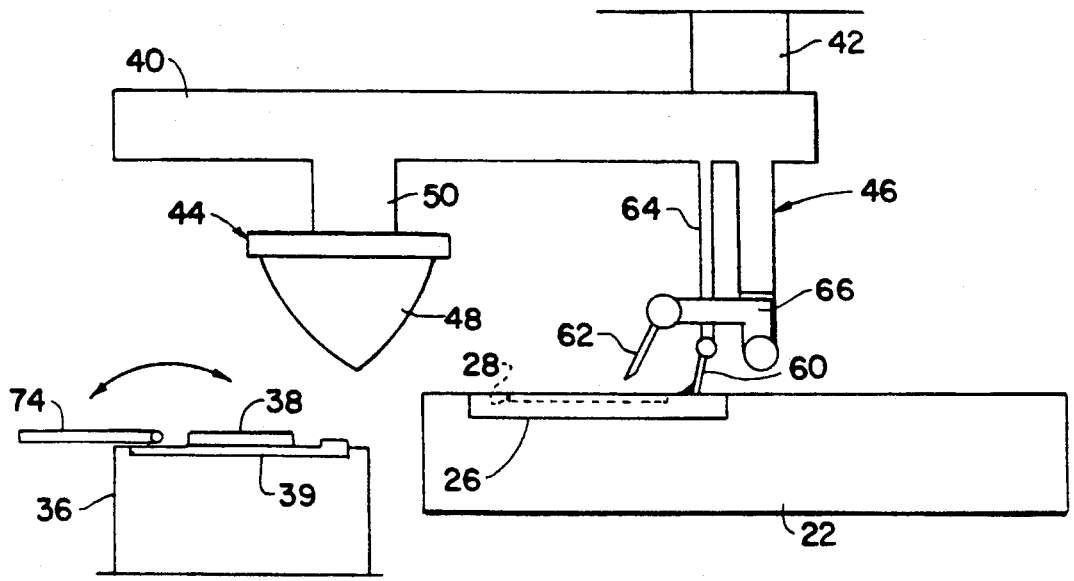
FIG. 1 is a schematic side elevation view of a pad printer of the type used to perform the present method, with the flood blade being shown applying ink to the gravure plate.

The present invention is a method of applying metallized contacts to the surfaces of a solar cell substrate. Although the present method is particularly advantageous for substrates having uneven surfaces, such as substrates grown by the EFG process, it may be satisfactorily used with a wide range of semiconductor substrates. As is known, a grid-like electrode, e.g., of the type illustrated in U.S. Pat. No. 3,686,036, is typically used on the front surface of solar cells to conduct current away from the p/n junction of the cell. Furthermore, it is conventional to cover the back side of a solar cell substrate with a contact consisting of a layer of metal such as aluminum. The present method is designed to apply such contacts to a solar cell substrate at a relatively low cost, with high throughput rates, and with very low substrate breakage rates.

The present method may be satisfactorily accomplished using a conventional pad printing machine 20 of the type widely used in the pad printing industry and illustrated schematically in FIGS. 1-6. Machine 20 comprises a base 22 for supporting a gravure plate 26. The latter includes one or more etched portions represented schematically at 28, the configuration of which corresponds to that of the metallized contact to be applied to the solar cell substrate. For the purposes of this invention, the depth of the depressions etched in the gravure plate are set in the range of 2.5 to 6 mils, preferably in excess of 3.0 mils but not exceeding 4.5 mils. That depth, which is greater than what is conventionally used for pad printing on domestic articles such as dishware, golf balls, etc., assures that a thick film of ink will be applied to the substrate by the pad printing machine.

Machine 20 also comprises a substrate support 36 for supporting a silicon substrate 38. Support 36 is positioned directly in front of gravure plate 26. Substrate support 36 preferably includes a vacuum chuck 39 for releasably holding the substrate. It should be noted that the thickness of substrate 38 is exaggerated in FIGS. 1-6 for the purpose of better illustrating the invention.

The pad printing machine 20 further comprises an elongate carriage 40 and a drive assembly 42 for supporting the carriage and causing the carriage to move back and forth along its longitudinal axis. Attached to carriage 40 in selected spaced relation are a pad assembly 44 and a blade assembly 46.

Pad assembly 44 includes a pad 48 and a translation device 50 for releasably securing the pad to the carriage 40 and for translating the pad between an upper position and a lower position, as discussed in greater detail below. Pad 48 has a generally conical shape and is typically made from silicone rubber. As discussed below in more detail, the configuration of pad 48 may be modified to correspond to that of the metallized contact to be printed. Also, to accomplish the present method, the durometer of pad 48 should be in the 15-40 range, Shore 00 scale, with a durometer of 20 being preferred.

Blade assembly 46 comprises a flood blade 60 for spreading printing ink over the top surface of gravure plate 26 and a doctor blade 62 for removing printing ink from all but the etched portion 28 of the gravure plate. Flood blade 60 is typically made from a relatively hard, rigid plastic material, and doctor blade 62 is typically made from hardened steel. Blade assembly 46 includes an actuation mechanism 64 for causing flood blade 60 to move between a lower position where the flood blade engages the top surface of gravure plate 26 and an upper position where the flood blade is spaced from the top surface of the gravure plate. Blade assembly 46 additionally includes an index mechanism 66 for causing doctor blade 62 to move between a lowered position where the doctor blade engages the top surface of gravure plate 26 and a raised position where the doctor blade is spaced from the top surface of the gravure plate.

Figure 2:
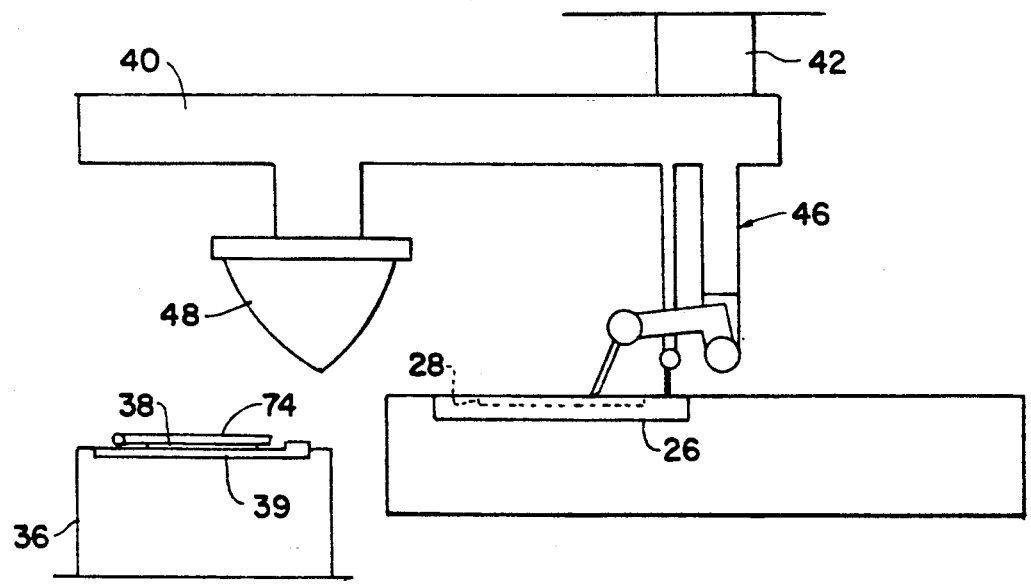
FIG. 2 is similar to FIG. 1, except that the doctor blade is shown removing excess ink from the gravure plate.
Figure 7:
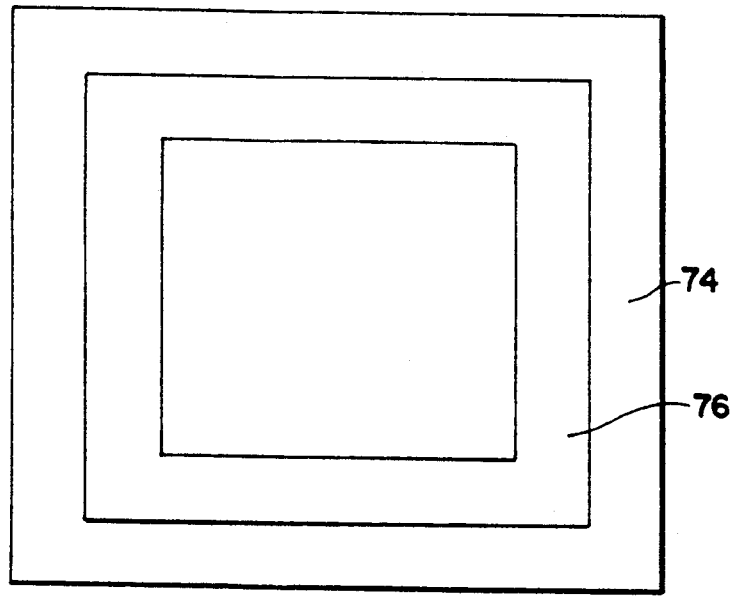
FIG. 7 is a plan view of a mask used to cover portions of a substrate being printed and a frame for supporting the mask.
Figure 8:
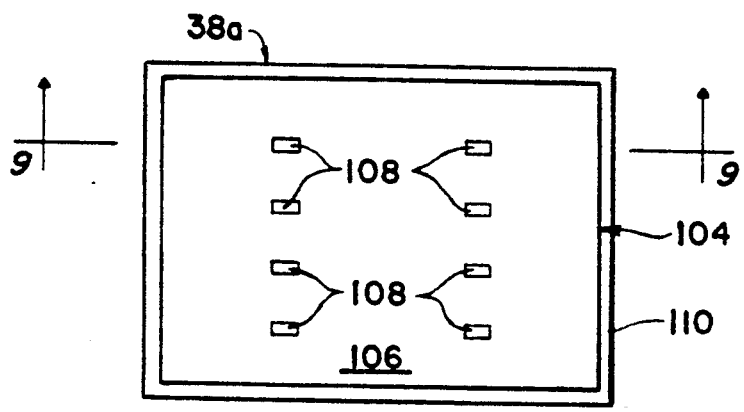
FIG. 8 is a plan view of a solar cell substrate having a contact applied to the back side thereof using the present method.

Referring to FIGS. 1, 2, and 7, as described in greater detail below, under certain circumstances it is desirable to mechanically block off certain portions of the exposed surface of substrate 38 prior to bringing pad 48 into engagement with the exposed surface of the substrate. Accordingly, the machine is modified to include a frame 74 for supporting a mask 76 (FIG. 7) for blocking portions of the exposed surface of substrate 38. As described in greater detail hereinafter, the size and shape of mask 76 corresponds to that portion of the surface of the substrate which is to be masked off. Frame 74 is pivotally mounted to substrate support 36 so as to be movable between a forward, non-operative position, as shown in FIG. 1, where mask 76 is positioned away from the exposed surface of substrate 38 and a rearward, operative position where mask 76 engages the exposed surface of substrate support 36, as shown in FIG. 2. Because a tight seal is not required between mask 76 and the back surface of the substrate, the weight of frame 74 alone is enough to hold mask 76 against the exposed surface of substrate 38.

A number of printing inks have been used satisfactorily to accomplish the present method. Essentially the inks may be conventional silk screen printing inks which have been diluted to provide a fluidity suitable for pad printing. The specific composition of the conventional silk screen printing inks is proprietary to the manufacturers of the inks. However, the conventional printing inks found to be useful in practicing this invention are believed to contain approximately 60-85 wt % metal particles, such as aluminum (or silver where a silver contact is to be made), with the remainder comprising organic binders such as ethyl cellulose and a solvent such as carbitol or terpineol. In the case of a silver ink, the ink also contains between about 4 wt. % and about 10 wt. % glass frit, preferably a lead borosilicate glass frit. These conventional inks generally have a viscosity of about 1000 poise at 25 degrees C. and a shear rate of 10/sec. According to this invention the inks are diluted so as to have a viscosity of about 50 poise at 25 degrees C. and a shear rate of 10/sec. Typically the diluted ink will have a metal particle concentration of between 50 and 75 wt. %.

For the purpose of applying aluminum contacts to a solar cell substrate, screen printing inks manufactured by Ferro Company of California, Electro Science Labs of Pennsylvania, and Engelhard Company of New Jersey which are diluted with a suitable solvent have been used. More specifically, an Engelhard aluminum screen printing ink #A3484 diluted by addition to the ink of carbitol in an amount in the range of 2-30 wt. % of the starting ink has been used to apply aluminum contacts to a silicon substrate using a conventional pad printing machine. The diluted ink should have a viscosity of about 50 poise at 25 degrees C. and a shear rate of 10/sec. Aluminum contacts have also been satisfactorily applied by pad printing using custom aluminum inks manufactured by Ferro Company and identified by product codes DP-53-020, DP53-015 and DP53-017, all of which have a viscosity of about 50 poise at 25 degrees C. and a shear rate of 10/sec.

Silver contacts have been applied to the rear side of a silicon substrate by pad printing using a conventional silver screen printing ink manufactured by Ferro Company and identified by product number 3398. The 3398 ink was diluted by adding carbitol in an amount equal to 5-20 weight percent of the ink, so as to give it a viscosity of about 50 poise as indicated above. A Ferro custom-made silver ink DP33-072 has also been used to apply silver contacts to the rear side of a silicon substrate. That custom-made ink also had a viscosity of about 50 poise and hence did not require dilution. Both inks contain a glass frit.

Front contacts have been applied to a solar cell substrate by pad printing using Ferro silver screen printing ink #3349 diluted by addition of carbitol in an amount equal to 2-30 weight percent of the ink.

In each case the ink is applied so as to have a thickness in the range of about 2 mils to about 4 mils before firing and a thickness of 4-10 microns after firing. The initial thickness of approximately 2-4 mils is due to the depth of the depressions etched in the gravure plate and also the surface tension of the ink.

In connection with the following description of the method of the present invention, reference should be made to FIGS. 1-7. As the first step in the method, a solar cell substrate 38 is secured to substrate support 36 so that the substrate is in predetermined, fixed, spaced relation to gravure plate 26. It is to be appreciated that substrate 38 has been subjected to several preliminary fabrication operations, such as the formation of a p/n junction, prior to its attachment to support 36. To ensure that successive solar cell substrates may be supported on support 36 in the same position relative to gravure plate 26 as substrate 38, support 36 preferably includes conventional registration means (not shown)

for positioning the substrates in a predetermined spatial relation to the gravure plate.

Next, or alternatively before substrate 38 is mounted to support 36, when it is desired to mask portions of the exposed surface of substrate 38, an appropriately-shaped mask 76 is attached to frame 74. As noted below in connection with the several specific examples of the present method, mask 76 is preferably made from a Mylar sheet having a thickness of about 5 mils. Then with substrate 38 in place on support 36, frame 74 is pivoted so as to bring mask 76 into contact with the exposed surface of substrate 38, as indicated in FIG. 2.

After dispensing printing ink onto the top surface of gravure plate 26, either manually or automatically, drive assembly 42 is activated to cause carriage 40 to move to the left as seen in FIG. 1, so that flood blade 60 spreads the ink across the top surface of gravure plate 26. Actuation mechanism 64 then operates to raise flood blade 60 up away from gravure plate 26.

Thereafter, carriage 40 is operated so that doctor blade 62 is positioned above the left edge (as seen in FIG. 2) of gravure plate 26. Index mechanism 66 is then operated so as to cause doctor blade 62 to move down into contact with the top surface of gravure plate 26. Then, as illustrated in FIG. 2, carriage 40 is then operated so as to cause doctor blade 62 to move to the right across the top surface of gravure plate 26 so as to wipe off excess ink on the gravure plate, i.e., all of the ink except for that in the etched portion(s) 28 of the plate.

Figure 3:
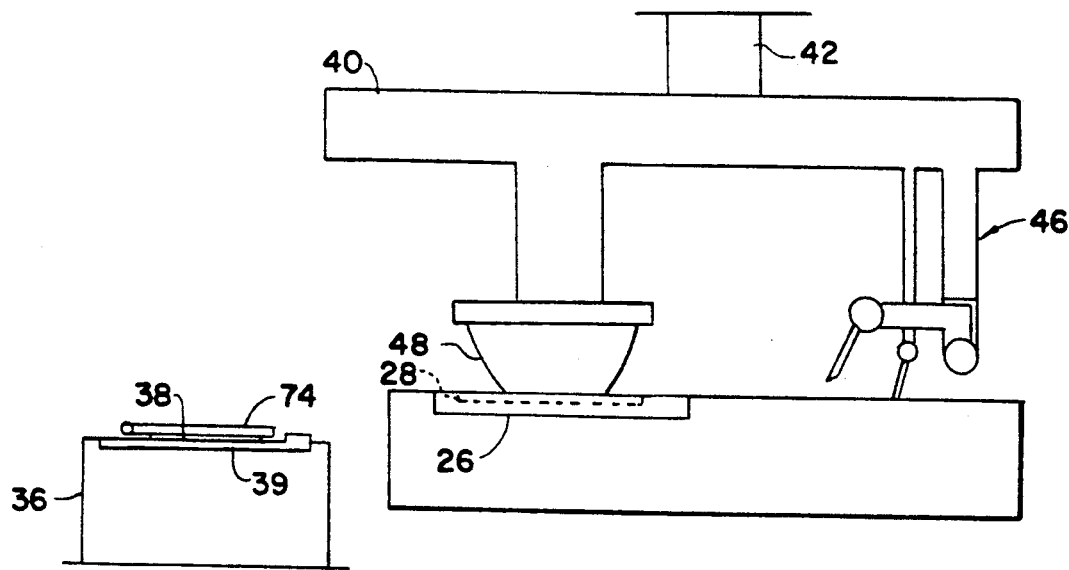
FIG. 3 is similar to FIG. 2, except that the pad is shown receiving ink from the etched portion of the gravure plate.

As carriage 40 is operated so as to cause doctor blade 62 to wipe off excess ink, pad 48 is moved to a position directly above the etched portion(s) 28 of gravure plate 26, as illustrated in FIG. 3. Such positioning must be highly precise, as well as repeatable over a large number of manufacturing cycles. Translation device 50 is then operated so as to lower pad 48 far enough for the bottom portion of the pad to contact the gravure plate 26 and pick up the ink in the etched portion(s) 28. Thereafter device 50 raises pad 48 out of contact with gravure plate 26.

Figure 4:
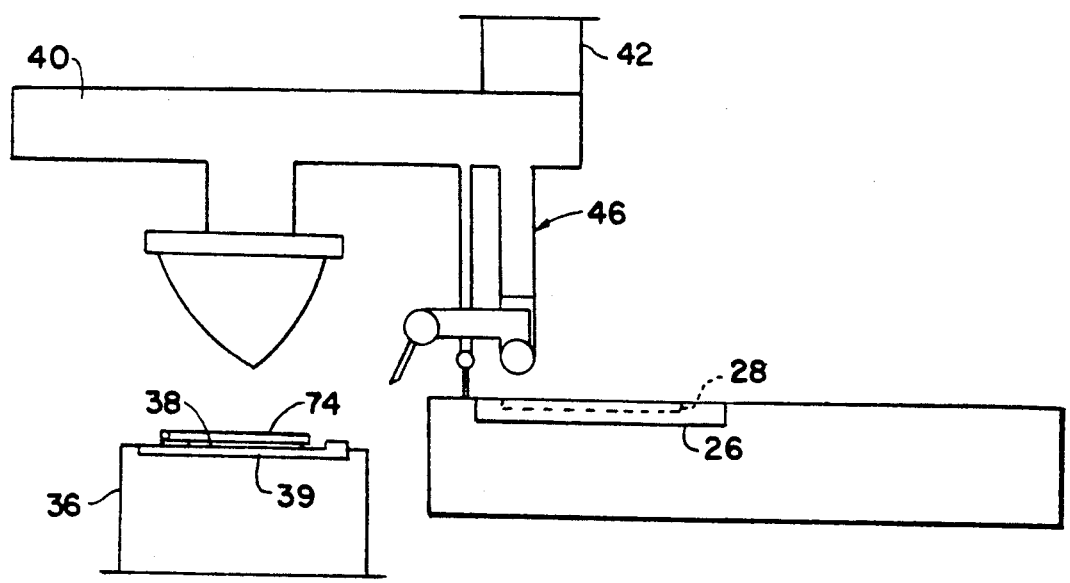
FIG. 4 is similar to FIG. 3, except that the ink-coated pad is shown positioned above the substrate on which an electrode is to be formed.

Then, as illustrated in FIG. 4, carriage 40 is operated so as to move pad 48 to the left to a position directly above substrate 38. This positioning must also be highly precise so that the ink pattern carried on pad 48 is properly registered with the edges of substrate 38 on a repeatable basis.

Figure 5:
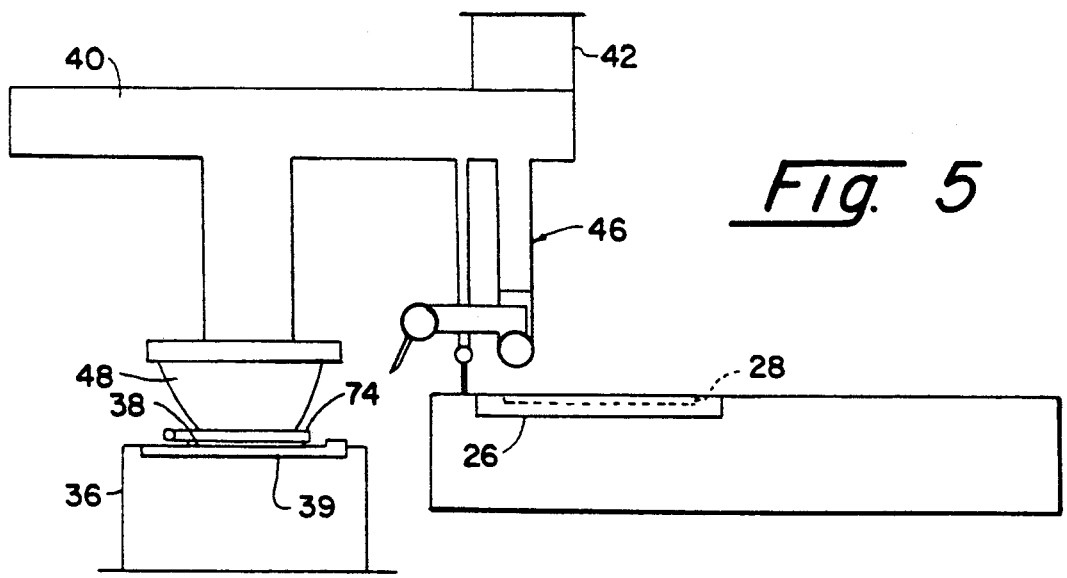
FIG. 5 is similar to FIG. 4, except that the pad is shown engaged with the top surface of the substrate.

Next, as shown in FIG. 5, translation mechanism 50 is operated so as to cause pad 48 to be lowered into contact with the top surface of substrate 38. Pad 48 is lowered just far enough to flatten its ink-bearing portions so as to cause those portions to make contact with the exposed area of the top surface of substrate 38.

Figure 6:
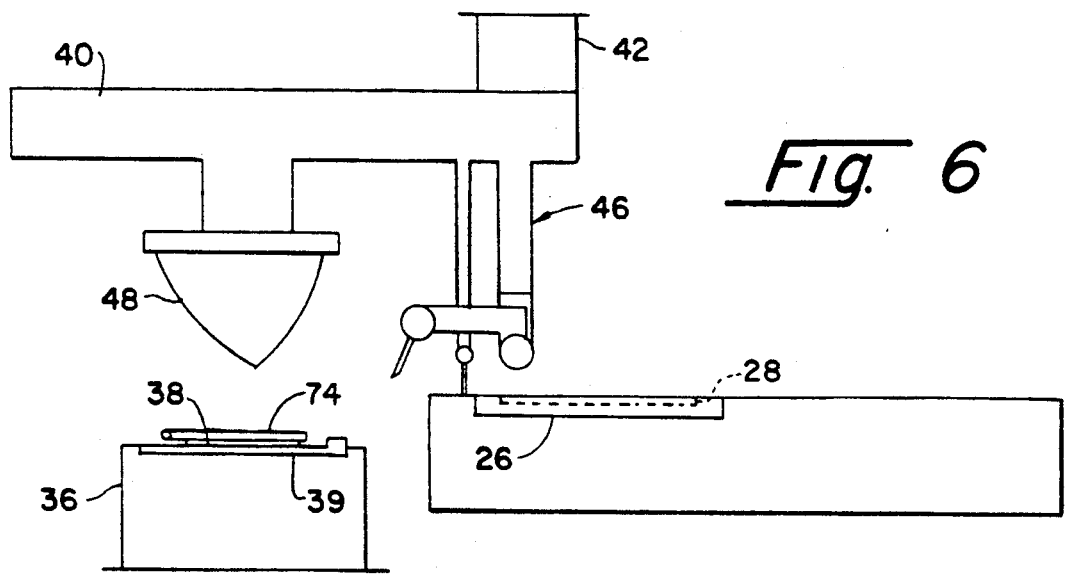
FIG. 6 is similar to FIG. 4, showing the pad positioned above the substrate, after having deposited ink on the top surface of the substrate.

Thereafter, as shown in FIG. 6, translation mechanism 50 is operated so as to raise pad 48 up above the exposed surface of substrate 38. While some ink may be transferred to the substrate as soon as the pad engages the substrate, it is believed that most of the ink is actually transferred from pad 48 to substrate 38 as the pad is lifted out of contact with the substrate. As noted above, the composition of the ink is selected so that the ink will adhere more readily to substrate 38 than to the surface of pad 48.

Figure 6A:
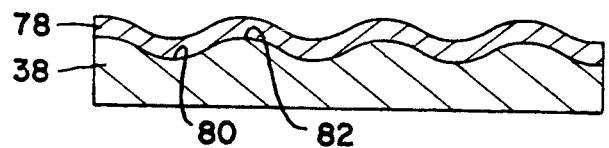
FIG. 6a is a cross-sectional view on an enlarged scale of a solar cell substrate having a uneven top surface, with a layer of printing ink of uniform thickness covering that top surface.

Referring to FIG. 6a, due to the conformal nature of pad 48, the thickness of the ink 78 applied to substrate 38 typically varies only about 1–5%. Thus, the thickness of the ink applied to the "valleys" 80 (FIG. 6a) of the substrate 38 surface is substantially identical to the thickness of the ink applied to the "peaks" 82 (FIG. 6a) of the substrate surface.

After the pad has been raised, the mask-supporting frame 74 is pivoted up away from the substrate 38, and then the latter is removed from holder 36. Thereafter, the substrate 38 is typically dried by heating it to a modest temperature that is adequate to evaporate the volatile solvent.

Later, the substrate is fired to pyrolyze the organic binder and fuse the metal compound in the ink to the substrate so as to form a good ohmic contact. In the case of an aluminum ink, the aluminum will form an alloy with the silicon substrate. The specific parameters of the firing process will vary depending upon a number of factors, the primary one of which is the composition of the printing ink. Specific firing parameters are described hereinafter in connection with the discussion of the several examples of the present method described below.

Depending upon the desired thickness of the metallized contacts to be applied to the substrate 38, one or more additional layers of ink may be applied on top of the existing ink using the above-described procedure. Such additional layers of ink may be applied before or after the first-applied layer of ink has been dried and/or fired.

First Example

Referring to FIGS. 1 and 8–12, the method of the present invention was used to apply a contact 104 (FIG. 8) to the back side of a crystalline silicon substrate 38a (FIG. 8) measuring approximately four inches long by four inches wide. The silicon substrate had a shallow P-N junction formed therein at a depth of about 0.5 microns below its front surface. Additionally the front surface of the substrate was coated with an anti-reflection coating in the form of a layer of silicon nitride having a thickness of about 800 Angstroms. Back contact 104 comprises a thin layer of aluminum 106 which includes a series of apertures 108 and also terminates short of the edges of the substrate so as to leave exposed a peripheral portion 110 of the rear surface of the substrate.

Figure 9:
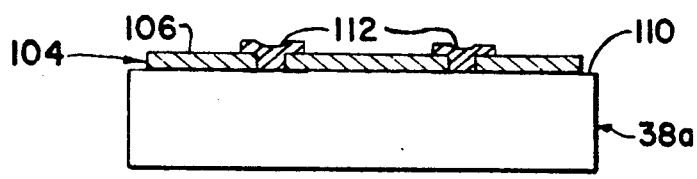
FIG. 9 is a cross sectional view taken along line 9—9 in FIG. 8.

As seen in FIG. 9, after contact 104 has been applied, a plurality of silver pads 112 are deposited in the apertures 108 so as to contact the substrate. Preferably, apertures 108 are arranged in two parallel rows.

Figure 10:
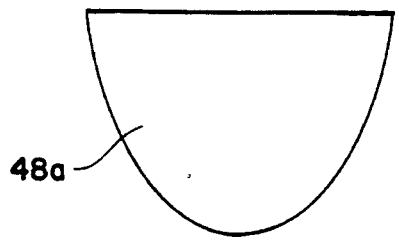
FIG. 10 is a side elevation view of a pad used to perform the present method.
Figure 11:
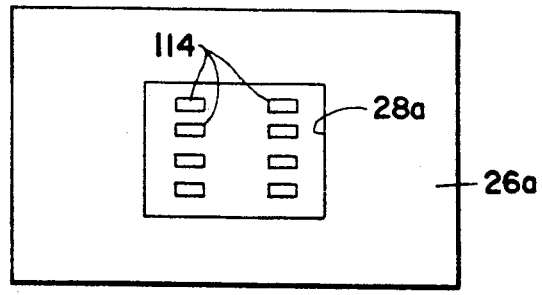
FIG. 11 is a plan view of the gravure plate used to form the back side contact shown in FIG. 8.

Back contact 104 was applied using a conventional pad printing machine. Referring to FIG. 10, a conventional silicone rubber pad 48a having a durometer of about 20 was used to print the ink.

The first example was performed using a gravure plate 26a (FIG. 11) comprising a rectangular recessed portion 28a formed by etching. The width and length of etched portion 28a were substantially identical to the corresponding dimensions of the back contact 104 applied to the silicon substrate, i.e. about 3.96" by 3.96". The depth of etched portion 28a was about 3.5 mils. Positioned inside etched portion 28a were a plurality of lands 114, the top surfaces of which were in co-planar relation with the top surface of gravure plate 26a. The lands 114 each had a rectangular configuration measuring about 0.150 ∝ 1 by 0.150" and were arranged in two parallel rows.

Aluminum back contact 104 was applied using an aluminum screen printing ink manufactured by Engelhard Company and identified by product code A3484. The screen printing ink was diluted by adding about 15 weight percent of carbitol. Satisfactory results have also been obtained when the Engelhard ink A3484 was diluted to other levels in the 2-30 weight percent range with the same solvent. Although the specific composition of the Engelhard A3484 ink is proprietary, it is believed the A3484 ink, before dilution as above described, contains about 60-70% aluminum particles, 10% organic binder, and 20-30% solvent.

Summarizing the steps of the process, as applied to this first example, the diluted Engelhard ink was first spread across gravure plate 26a, and then was removed from all but etched portion 28a. Then, a mask 76 (FIG. 7) previously attached to frame 74 was positioned on the back surface of the substrate by pivotally moving the frame into surrounding relationship with the substrate. The weight of frame 74 (which was made of aluminum) alone held the mask 76 in contact with the back side of substrate 38a. Mask 76 was made of Mylar having a thickness of about 5 mils, and was configured to block application of ink to only the peripheral edge portion 110 on the back surface of the substrate 38a. Portion 110 had a width of about 0.04". As noted above, mask 76 is used to assure that stray deposits of ink on portions of the surface of gravure plate 26 outside of the area corresponding to etched portion 28a will not be deposited on the rear surface of the substrate, thereby leaving the peripheral portion 110 free of ink.

Next, pad 48a was (1) lowered into contact with etched portion 28a to pick up the ink, (2) raised, (3) moved to a predetermined registered position above the substrate 38a, (4) lowered into contact with the back surface of the substrate, and (5) raised away from the back surface, whereby printing ink in the configuration of etched portion 28a was deposited on the back surface of the substrate.

By this first printing operation, aluminum printing ink was applied to all of the back surface of the substrate except for the peripheral portion 110 (because of mask 76) and apertures 108. Because printing ink was removed from the top surfaces of lands 114 by the doctor blade, the pad 48a did not pick up any ink from those lands and hence apertures 108 were formed. The ink pattern formed by the pad was centered on the substrate as shown by proper positioning of substrate 38a on substrate support 36.

The substrate was then removed from support 36 and transferred to a furnace where it was heated to drive off the solvent and binder in the printed contact 104 and cause the contact to fuse securely to the substrate. Specifically, using a conventional belt furnace having a 54" firing zone, the substrate was fired in a nitrogen ambient atmosphere for about three minutes to drive off the solvent, pyrolyze the binder and fuse the remaining metal component of the ink to the substrate. The firing was accomplished by ramping the substrate temperature from 200° C. to a level in the range of 670° C. to 850° C., and then back down to 200° C. Then the substrate was removed from the furnace and allowed to cool in air to room temperature. The fired aluminum contact had a thickness of about 7 microns ±3 microns. In certain fabrication sequences where it is not desired to fire the substrate while the printed ink is still wet, the substrate may be dried at 100°-150° C. for 5-15 minutes. Thereafter, it may be fired in a nitrogen atmosphere, as described above.

Figure 12:
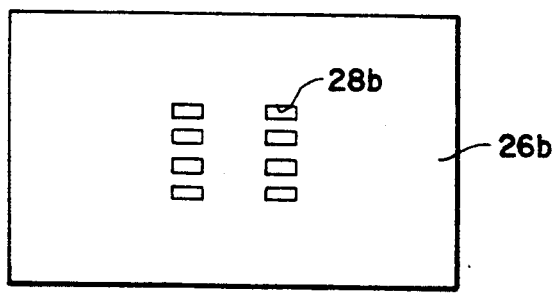
FIG. 12 is a plan view of the gravure plate used to form the silver pads on the back side contact shown in FIG. 8.

The substrate was then subjected to a second printing operation using a second gravure plate 26b illustrated in FIG. 12. Gravure plate 26b includes etched depressions 28b which correspond in shape and placement to the lands 114 in etched portion 28a of gravure plate 26a (FIG. 10). Preferably the horizontal dimensions of depressions 28b exceed the corresponding dimensions of lands 114 by about 0.03", e.g., depressions 28b measure 0.180" by 0.180". The depth of depressions 28b was also about 3.5 mils.

The second printing operation was performed using a silver screen printing ink manufactured by Ferro Company of Santa Barbara, Calif. and identified by product code 3398. The 3398 ink is believed to contain about 80% metal solids (of which about 3% is aluminum and about 77% is silver); the remainder of the ink is made up of a glass frit (believed to be a lead borosilicate glass frit in a amount equal to about 5 wt. % of the ink), a pyrolyzable organic binder and an organic solvent. The 3398 ink was diluted by adding about 10 weight percent carbitol. This second printing operation may be carried out in the same pad printing machine used for forming contact 104 or in another machine.

The second printing operation was performed in substantially the same manner as the first printing operation described above, except that the back side of the substrate was not masked prior to printing. The placement of etched portions 28b on gravure plate 26b, and the position above the substrate to which pad 48 is moved for the second printing operation are precisely controlled so that the silver printing ink picked up by the pad from etched portions 28b is deposited precisely in the rectangular apertures 108 in aluminum back contact 104 and also overlaps that aluminum contact by about 0.03" at each side of those apertures. FIG. 9 illustrates that silver pads 112 are generally T-shaped in vertical cross-section, with the pads overlapping and making electrical contact with aluminum layer 106.

Figure 13:
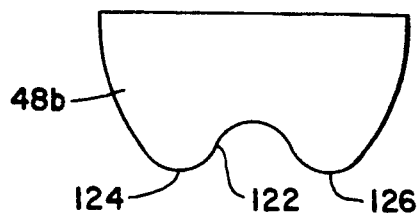
FIG. 13 is a side elevation view of a pad used to apply the silver pads to the back contact shown in FIG. 8.

As an optional and preferred measure, the second printing operation may be carried out using pad 48b (FIG. 13) in place of pad 48a. Pad 48b, is similar to pad 48a, except that a valley 122 is provided in the center of the pad. By providing valley 122, two parallel, similarly-shaped contact surfaces 124 and 126 are formed. The spacing between contact surfaces 124 and 126 corresponds to the spacing between the rows of etched portions 28b in gravure plate 26b (allowing for the preferred overlap of rear contact 104 by silver pads 112). The presence of valley 122 serves to reduce the stress applied by the pad to the substrate. By decreasing this stress, the incidence of substrate breakage is reduced.

Figure 14:
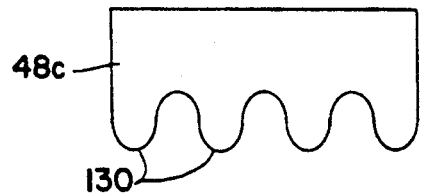
FIG. 14 is a side elevation view of another pad used to apply the silver pads to the back contact shown in FIG. 8.

FIG. 14 illustrates an alternative form of pad 48c which may be used in place of pad 48b to apply silver pads 112 to apertures 108 in contact 104. Pad 48c is made of silicon rubber and has a durometer in the 15-40 range. Furthermore, pad 48c is formed so as to have a plurality of small conical ink-applying pad portions 130, one for each of the silver pads 112. Thus, when pad 48c is lowered into contact with gravure plate 26b and later into contact with the substrate, each pad portion 130 picks up ink from a corresponding respective etched portion 28b and applies it to the substrate so as to fill and overlap apertures 108.

Upon completion of the second printing operation, the silver printing ink was fired in an infra-red furnace in an air ambient atmosphere for 3 minutes. The firing began at 200° C., was ramped up to a temperature in the range of 670°-850° C., and then was ramped back down to 200° C. The fired substrate was then removed from the furnace and allowed to cool in air to room temperature. The fired silver pads 112 had a thickness of about 8-20 microns.

Following the firing, the solar cell was subjected to additional known fabrication operations.

Second Example

Figure 15:
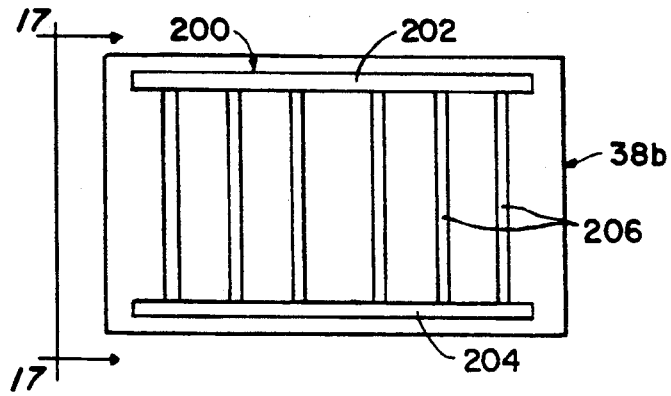
FIG. 15 is a plan view of a solar cell substrate having a grid contact applied to the front side thereof using the present method.

The method of the present invention was also used to apply a grid contact 200 (FIG. 15) to the front side of a crystalline silicon substrate 38b measuring about four inches wide by four inches long. The substrate had been processed so as to have a shallow P-N junction at a depth of about 0.5-0.6 microns below its front surface. Additionally, the front side of the substrate was covered with a layer of silicon nitride measuring about 800 Angstroms thick. Front contact 200 comprises a pair of parallel, spaced bus bars 202 and 204, and a plurality of parallel fingers 206 extending between bus bars 202 and 204 so as to extend perpendicular thereto.

Figure 16:
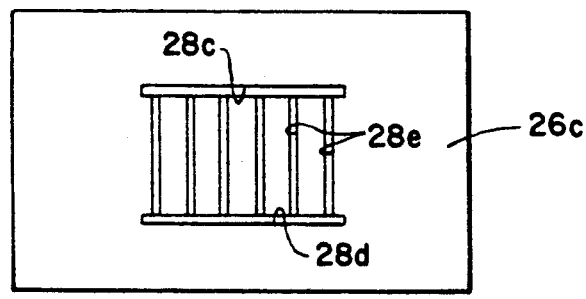
FIG. 16 is a plan view of the gravure plate used to form the front side grid contact shown in FIG. 15.

Front contact 200 was applied using a conventional pad printing machine and a generally conically-shaped pad 48a as illustrated in FIG. 10. A gravure plate 26c, as illustrated in FIG. 16, was used with the pad printing machine. Gravure plate 26c comprises a pair of parallel, spaced etched depressions 28c and 28d having a configuration corresponding to that of bus bars 202 and 204, and a plurality of parallel, narrow etched depression 28e extending between portions 28c and 28d so as to extend perpendicular thereto. Etched portions 28c and 28d had a depth of 2.5 mils, and etched portions 28e had a depth of 4 mils.

Front contact 200 was applied using a standard silver screen printing ink manufactured by Ferro Company of Santa Barbara, Calif. and identified by product code 3349. Although the specific compositions of the 3349 ink is proprietary, it is believed to consist of about 65-80 wt. % silver, about 5 wt. % lead borosilicate glass frit, and about 15 wt. % liquid vehicle comprising an organic binder such as ethyl cellulose and a solvent such as terpineol or carbitol. The 3349 ink was diluted by addition of about 10 weight percent carbitol. Satisfactory results have also been achieved when the Ferro 3349 ink was diluted by addition of carbitol in different amounts in the 2-30 wt. % range.

The diluted Ferro silver screen printing ink 3349 was applied to the front surface of the silicon substrate using a conventional pad printing machine and pad 48a (FIG. 10) substantially in accordance with the process described above in the first example for applying the aluminum back contact 106 to substrate 38a. However, application of front contact 200 did not involve a masking step.

Summarizing the steps of the process of the second example, the diluted Ferro silver ink was first spread across gravure plate 26c, and then was removed from all but etched portions 28c, 28d, and 28e using a doctor blade as shown at 62. Next, pad 48a was lowered into contact with the gravure plate so as to pick up ink from the etched portions 28c, 28d, and 28e, then raised, moved to a predetermined registered position above the substrate 38b, lowered onto the front surface of the substrate, and raised again away from the front surface, whereby printing ink in the configuration of etched portions 28c, 28d, and 28e was deposited on the silicon nitride coating covering the front surface of the substrate. The predetermined, registered position of the pad 48a relative to the substrate 38b was chosen so that the ink pattern on the pad was centered on the substrate.

Finally, the substrate 38b was removed from support 36 and fired for three minutes in an infra-red furnace, in an air ambient atmosphere, with the temperature being ramped up from 200° C. to a temperature of about 800°-850° degrees C. and ramped back down to 200° C. The firing resulted in the ink passing through the silicon nitride and forming an ohmic contact with the underlying silicon substrate. Following the firing, the substrate was cooled to room temperature in air. Thereafter, several additional conventional fabrication steps were performed on the substrate so as to produce a working solar cell.

It is to be noted that the preference that the silver pads 112 overlap the aluminum back contact 104, as shown in FIG. 9, results in part from a desire to avoid or overcome any printer registration problems and in part from a desire to increase the contact area between silver pads 112 and the rear aluminum layer 106. Preferably the overlap is about 0.03 inch. Nevertheless it also is contemplated that the silver pads may be formed so as to fully fill the apertures 108 without any overlap.

Advantages of the Invention

One important advantage of the present invention is that the force applied to the substrate by the pad is significantly less than the force applied to the substrate when the contact is printed by a silk screen process. By applying the contact with a very soft pad (preferred Shore 00 scale durometer of 20), instead of a hard, narrow blade, as is done with screen printing, substrate breakage rates are reduced significantly. This reduction in breakage is particularly important for large (e.g. 4"×12") silicon substrates.

Figure 17:
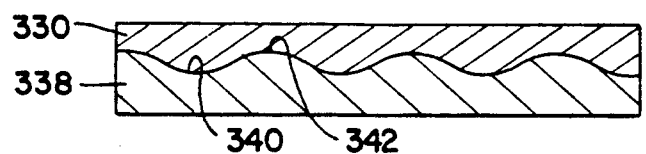
FIG. 17 is a cross-sectional view of a solar cell substrate having an uneven top surface, with a layer of printing ink having a thickness which varies with the configuration of the top surface covering the top surface.

Another advantage of the present invention over the screen printing method of applying metallized contacts, is that the thickness of the contacts is far more uniform across the length and width of the contact when the contact is applied to a substrate having an irregular or uneven surface (e.g. an EFG-grown substrate). Because of the material (silicone rubber) used to fabricate the printing pad, the softness of the pad (15-40 Shore 00 scale durometer), and the configuration of the pad (generally conical), the pad is able to conform very closely to the irregular surface of the silicon substrate being printed (without subjecting the substrate to undue stress when pressed down against the substrate in the manner shown in FIG. 6a). Consequently, the thickness of the ink applied to the "valleys" in the surface of the substrate is substantially the same as the thickness of the ink applied to the "peaks". On the other hand, as illustrated schematically in FIG. 17, when a metal ink 330 is applied by screen printing to a silicon substrate 338 having uneven surfaces, the ink coating tends to be relatively thick in the "valleys" 340 of the surface and relatively thin on the "peaks" 342 of the surface.

An important advantage of applying a metallized coating of uniform thickness to the surface of the substrate is that the tendency of the substrate to bow as a consequence of the firing process is reduced significantly. Such bowing is problematic since it can lead to substrate breakage. Furthermore, by applying metallized contacts of uniform thickness, less metal is required. This savings of material, especially in the case of silver contacts, may reduce significantly the cost of fabricating a solar cell.

It is to be noted also that the invention permits the ink to be laid down on the substrate with a thickness comparable to what can be achieved with silk screen techniques, so that the fired contacts made by this invention are substantially as thick as those made using the silk screen process. On the other hand, use of the present invention subjects the substrates to less physical deformation during ink application than what occurs when the ink is applied by silk screening.

Forming the silver pads 112 so that they overlap the rear contact 104 also is advantageous in that it increases the contact area between those elements and minimizes printer registration problems.

Although the present method has been described primarily as a technique for applying metallized contacts to crystalline silicon solar cell substrates, it is to be appreciated that the present method may also be satisfactorily employed in the fabrication of other semiconductor devices. Furthermore, the present method also has application in the fabrication of solar cells from substrates having relatively smooth surfaces, such as amorphous silicon substrates or substrates sliced from Czochralski-grown boules.

Since certain changes may be made in the above process without departing from the scope of the invention herein involved it is intended that all matter contained in the above description or shown in the accompanying drawings shall be interpreted in an illustrative and not in a limiting sense.

What is claimed is:

1. A method for applying a metallized conductor to an uneven surface of a crystalline silicon semiconductor solar cell substrate comprising the following steps:
   (a) providing a pad printing apparatus comprising (1) a plate having a top surface in which is etched a cavity corresponding in size and shape to that of a metallized conductor to be applied to the surface of a semiconductor substrate, (2) a flexible pad, and (3) a support for releasably supporting a semiconductor substrate, said support being positioned adjacent and in fixed relation to said plate;
   (b) positioning a crystalline silicon semiconductor substrate on said support so that said surface of said substrate is exposed;
   (c) filling said cavity of said plate with a metal-containing printing ink;
   (d) contacting said plate with said pad so as to permit said printing ink to adhere to said pad;
   (e) moving said pad into engagement with said one surface of said substrate; the composition and configuration of said pad, the depth of said cavity, and the composition of said printing ink being selected so that said printing ink is transferred to said one surface of said substrate with a uniform thickness in the range of 2-4 mils; and
   (f) moving said pad out of contact with said substrate, whereby said printing ink is transferred to said one surface.

2. A method according to claim 1 wherein said printing ink comprises a pyrolyzable binder, and a volatile solvent, said method further comprising the step of firing said substrate so as to cause the metal component of said printing ink to adhere securely to said one surface whereby a metallized conductor having a thickness of about 4-10 microns is produced after firing.

3. A method according to claim 2 wherein said substrate has a front surface and a layer of dielectric covering said front surface; said printing ink includes a glass frit, and said uneven surface is the surface of said dielectric layer, and further wherein the step of firing said ink causes said ink to penetrate said dielectric layer and make an ohmic contact with said substrate.

4. A method according to claim 3 wherein said substrate includes a shallow p/n junction adjacent said front surface thereof, and further including the step of forming a silver electrode on a back surface of said semiconductor substrate.

5. A method according to claim 4 wherein said silver electrode is formed by pad printing.

6. A method according to claim 1 wherein said pad provided has a durometer ranging from 15 to 40 (Shore 00 scale).

7. A method according to claim 6 wherein said durometer is about 20 (Shore 00 scale).

8. A method according to claim 1 wherein said steps (d), (e) and (f) are repeated as a group one or more times so as to apply multiple layers of printing ink to said substrate.

9. A method according to claim 1 wherein said ink has a viscosity of about 50 poise at 25 degrees C. and a shear rate of 10/sec.

10. A method of applying a metallized conductor to one of the surfaces of a crystalline semiconductor substrate comprising the following steps:
    a) providing a pad printing apparatus comprising (1) a plate having a top surface in which is etched a cavity corresponding in size and shape to that of a metallized conductor to be applied to said one surface of said substrate, (2) a flexible pad, and (3) a support for releasably supporting a semiconductor substrate, said support being positioned adjacent and in fixed relation to said plate;
    b) positioning said crystalline semiconductor substrate on said support so that said one surface of said substrate is exposed;
    c) filling said cavity of said plate with a metal-containing printing ink;
    d) contacting said plate with said pad so as to permit said printing ink to adhere to said pad;
    e) mechanically masking at least one selected portion of said one surface of said substrate so as to prevent said pad from applying said printing ink to said at least one selected portion of said one surface;
    f) moving said pad into engagement with said masked one surface of said substrate; and
    g) moving said pad out of contact with said masked one surface of said substrate, whereby said printing ink is transferred to the unmasked portions of said one surface of said substrate.

11. A method according to claim 10 wherein following step (g) said mask is removed and said substrate is fired so as to cause the metal component of said printing ink to adhere securely to said one surface as a metal layer.

12. A method according to claim 11 wherein said printing ink comprises a pyrolyzable binder, and a volatile solvent, and further wherein said substrate is fired under conditions whereby said binder and solvent are removed from said ink and said metal component is metallurgically bonded to said one surface.

13. A method according to claim 11 wherein a second metal printing ink is applied to said at least one selected portion of said one surface, and said second metal printing ink is fired to cause the metal component of said second ink to adhere to said substrate.

14. A method according to claim 13 wherein said first mentioned ink is an aluminum-containing ink and said second ink is a silver-containing ink.

15. A method according to claim 11 wherein said at least one selected portion of said one surface comprises at least two mutually spaced portions.

16. A method according to claim 15 wherein said second ink is applied so as to cover said two mutually spaced portions of said one surface and adjacent portions of said metal layer.

17. A method of applying a metallized conductor to an uneven surface of a crystalline silicon substrate comprising the following steps:
   a) providing a pad printing apparatus comprising (1) a plate having a top surface in which is etched a cavity corresponding in size and shape to that of a metallized conductor to be applied to the surface of a semiconductor substrate, (2) a flexible pad, and (3) a support for releasably supporting a semiconductor substrate, said support being positioned adjacent said plate;
   b) positioning a crystalline silicon substrate on said support so that said uneven surface is exposed;
   c) filling said cavity of said plate with a metal printing ink;
   d) contacting said plate with said pad so as to permit said printing ink to adhere to said pad;
   e) mechanically masking at least one selected portion of said uneven surface of said substrate so as to prevent printing ink adhered to said pad from being applied to said at least one selected portion of said surface; and,
   f) moving said pad into engagement with said masked uneven surface of said substrate so as to transfer said printing ink adhered to said pad to the unmasked portion(s) of said uneven surface in a layer of uniform thickness.

18. A method of applying a back contact to a crystalline solar cell substrate comprising the following steps:
   (a) providing a pad printing apparatus comprising (1) a first plate having a top surface in which is formed a first cavity having a selected configuration, said first plate comprising a plurality of lands positioned in said first cavity, each of said plurality of lands having a top surface which is coextensive with said top surface of said first plate, (2) a flexible pad, and (3) a support for releasably supporting a semiconductor substrate in fixed relation to said plate;
   (b) providing a solar cell substrate having a front surface and a rear surface, and positioning said substrate on said support so that said back surface exposed;
   (c) filling said first cavity of said first plate with an aluminum printing ink so that said top surfaces of said lands are not covered with said ink;
   (d) contacting said plate with said pad so as to permit said printing ink to adhere to said pad;
   (e) moving said pad into contact with said back surface of said substrate so as to transfer said printing ink on said pad to said back surface so that a pattern of ink corresponding in configuration to that of said selected configuration is applied to said back surface, said pattern including a plurality of apertures, each corresponding in configuration and placement to a respective one of said plurality of lands;
   (f) providing a pad printing apparatus comprising (1) a second plate in which is formed a plurality of second cavities that correspond in shape and placement to said lands in said first plate, (2) a flexible pad, and (3) a support for releasably supporting said solar cell substrate;
   (g) positioning said solar cell substrate on said support so that said back side thereof is exposed;
   (h) filling said plurality of second cavities with a silver printing ink that comprises a glass frit;
   (i) contacting said second plate with said pad so as to permit said silver printing ink to adhere to said pad; and
   (j) moving said pad into contact with said portions of said back surface of said substrate exposed through said plurality of apertures in said pattern so as to transfer said silver ink adhered to pad to said exposed portions of said substrate.

19. A method of applying a back contact to a crystalline solar cell substrate comprising the following steps:
   a) providing a pad printing apparatus comprising (1) a first plate having a top surface in which is formed a first cavity having a selected configuration, said first plate comprising a plurality of lands positioned in said first cavity, each of said plurality of lands having a top surface which is coextensive with said top surface of said first plate, (2) a flexible pad, and (3) a support for releasably supporting a semiconductor substrate in fixed relation to said plate;
   b) providing a solar cell substrate having a front surface and a back surface, and positioning said substrate on said support so that said back surface is exposed;
   c) filling said first cavity of said first plate with an aluminum printing ink so that said top surfaces of said plurality of lands are not covered with said ink;
   d) contacting said plate with said pad so as to permit said printing ink to adhere to said pad;
   e) mechanically masking a peripheral portion of said back surface so as to prevent transfer of said aluminum printing ink to said peripheral portion; f) moving said pad into contact with said back surface of said substrate so as to transfer said printing ink on said pad to said back surface so that a pattern of ink corresponding in configuration to that of said selected configuration is applied to said back surface, said pattern including a plurality of apertures, each corresponding in configuration and placement to a respective one of said plurality of lands;
   g) providing a pad printing apparatus comprising (1) a second plate in which is formed a plurality of second cavities that substantially correspond in shape and placement to the lands in said first plate, (2) a flexible pad, and (3) a support for releasably supporting said solar cell substrate;
   h) positioning said solar cell substrate on said support so that said back side thereof is exposed;
   i) filling said plurality of second cavities with a silver printing ink;
   j) contacting said second plate with said pad so as to permit said silver printing ink to adhere to said pad; and
   k) moving said pad into contact with said portions of the back surface of said substrate exposed through said apertures in said pattern so as to transfer said silver ink adhered to said pad to said exposed portions of said substrate.

20. A method according to claim 19 wherein in step (i) said silver printing ink comprises a glass frit.

* * * * *

UNITED STATES PATENT AND TRADEMARK OFFICE
CERTIFICATE OF CORRECTION

PATENT NO. : 5151386
DATED : September 29, 1992
INVENTOR(S) : Frank Bottari et al It is certified that error appears in the above-identified patent and that said Letters Patent is hereby corrected as shown below:

Claim 18, column 15, line 49, the word "is" should be added before the word -- exposed --;

Claim 18, column 16, line 13, the word "said" should be added before the word -- pad --;

Claim 19, column 16, line 38, after the semi-colon, the phrase beginning with "f) mov-" should be a new paragraph.

Signed and Sealed this

Fifth Day of October, 1993

Attest:

BRUCE LEHMAN

Attesting Officer    Commissioner of Patents and Trademarks